(12) United States Patent
Van Empel

(10) Patent No.: US 7,492,441 B2
(45) Date of Patent: Feb. 17, 2009

(54) LITHOGRAPHIC APPARATUS AND DEVICE MANUFACTURING METHOD INCORPORATING A PRESSURE SHIELD

(75) Inventor: Tjarko Adriaan Rudolf Van Empel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 595 days.

(21) Appl. No.: 11/314,156

(22) Filed: Dec. 22, 2005

(65) Prior Publication Data

US 2007/0146656 A1    Jun. 28, 2007

(51) Int. Cl.
G03B 27/42 (2006.01)
G03B 27/52 (2006.01)
G03B 27/58 (2006.01)

(52) U.S. Cl. .................. 355/53; 355/30; 355/72
(58) Field of Classification Search .................. 355/30, 355/53, 72, 77; 430/311
See application file for complete search history.

(56) References Cited

U.S. PATENT DOCUMENTS

| 6,757,048 | B2 * | 6/2004 | Arakawa | 355/30 |
| 7,098,991 | B2 * | 8/2006 | Nagasaka et al. | 355/53 |
| 2005/0018160 | A1 * | 1/2005 | Dams et al. | 355/53 |

* cited by examiner

*Primary Examiner*—Alan A Mathews
(74) *Attorney, Agent, or Firm*—Sterne, Kessler, Goldstein & Fox P.L.L.C

(57) ABSTRACT

A lithographic apparatus is disclosed that has a movable article support configured to hold and move an article, a radiation control system configured to control a beam of radiation to be targeted onto the article, the article support, or both, the article to be moved relatively to the radiation control system by the movable article support for measurement, exposure, or both purposes, and a pressure shield that is mechanically uncoupled from the radiation control system to shield against pressure waves induced by the article support so as to help prevent displacement of the radiation control system caused by the pressure waves.

21 Claims, 4 Drawing Sheets

LITHOGRAPHIC APPARATUS AND DEVICE MANUFACTURING METHOD INCORPORATING A PRESSURE SHIELD

FIELD

The present invention relates to a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, an article, such as a substrate, a mask or a fiducial to be placed in the radiation beam, is held by an article support member, for example, by a clamping electrode, vacuum suction or otherwise.

Typically, these articles are positioned in a single or multistage positioning procedure which includes alignment and/or height adjustment of the article. To this end, typically one or more contactless measurement systems are used, which measurement systems direct a radiation beam to the article for measurement purposes, e.g. by interferometric measurements or by the use of a grating image. Also, a projection system is typically used to transfer a patterned beam onto a target portion of the article, in particular, the substrate, for exposure purposes of the article. For all these radiation control systems, in particular, a positioning sensor system and/or a projection system, a desire arises for them to be very stably mounted in order for them to be able to provide measurements and/or exposed features with in the order of (sub-) nanometer accuracies. To this end, a conventional lithographic apparatus may provide a metrology frame used to hold and keep substantially in place equipment used to measure distances used to position the substrate and the like and/or to hold and keep substantially in place equipment used to transfer a pattern to the substrate. This metrology frame is a stabilized frame that is protected against vibrations from outside so that it creates a super stable environment or "silent world" wherein the lithographic process is carried out, in particular, the positioning of a substrate and transfer of a pattern onto a target portion of the substrate.

On the other hand, a lithographic apparatus has moving parts which increasingly move faster and faster (to increase throughput) and which put a burden on the stability of equipment in the lithographic apparatus, especially on the mounting of measurement and/or exposure equipment.

SUMMARY

An aspect that should be taken into account is the generation of pressure waves by moving parts. These waves can be problematic, for example, for interferometric measurement in that the refractive index of the gas through which the interferometric beam passes may be altered by variation of pressure, so that a measurement becomes inaccurate. In addition or alternatively, with the increasing faster movement of these parts, these pressure waves may cause a physical displacement of a radiation control system, which may give rise to deteriorated imaging and/or measurement accuracy. Accordingly, it would be desirable, for example, to provide a lithographic apparatus which is more robust and less sensitive to the presence of these pressure waves.

According to an aspect of the invention, there is provided a lithographic apparatus, comprising: a movable article support configured to hold and move an article; a radiation control system configured to control a beam of radiation to be targeted onto the article, the article support, or both, the article to be moved relatively to the radiation control system by the movable article support for measurement, exposure, or both purposes; and a pressure shield that is mechanically uncoupled from the radiation control system to shield against pressure waves induced by the article support so as to help prevent displacement of the radiation control system caused by the pressure waves.

According to an aspect of the invention, there is provided a lithographic apparatus configured to transfer a pattern to a substrate, comprising: a table configured to be moveable and to hold a substrate or a patterning device; and a pressure shield that is not directly connected to a displacement sensitive device to shield the device from pressure waves induced by movement of the table so as to substantially prevent displacement of the device caused by the pressure waves.

According to an aspect of the invention, there is provided a device manufacturing method, comprising: moving a table holding a substrate or a patterning device; shielding a displacement sensitive device from pressure waves induced by the movement of the table so as to substantially prevent displacement of the device caused by the pressure waves; and transferring a pattern to a substrate.

In the context of this application, the "article" may be a substrate (e.g., a wafer), a patterning device (e.g., a reticle or mask), any other article or optical element (e.g., a mask blank) that is provided in the radiation path of a radiation control system, or any combination of the foregoing. More specifically terms such as a substrate to be processed in manufacturing devices employing lithographic projection techniques, a lithographic projection mask in a lithographic projection apparatus, a mask handling apparatus such as a mask inspection or cleaning apparatus, or a mask manufacturing apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
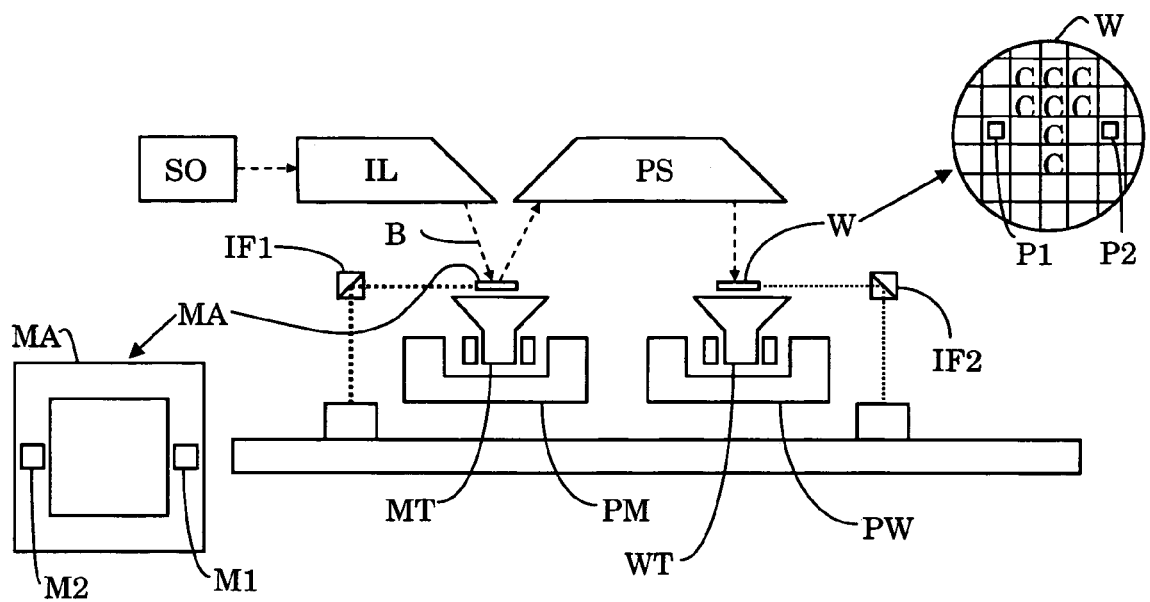
FIG. 1 schematically depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
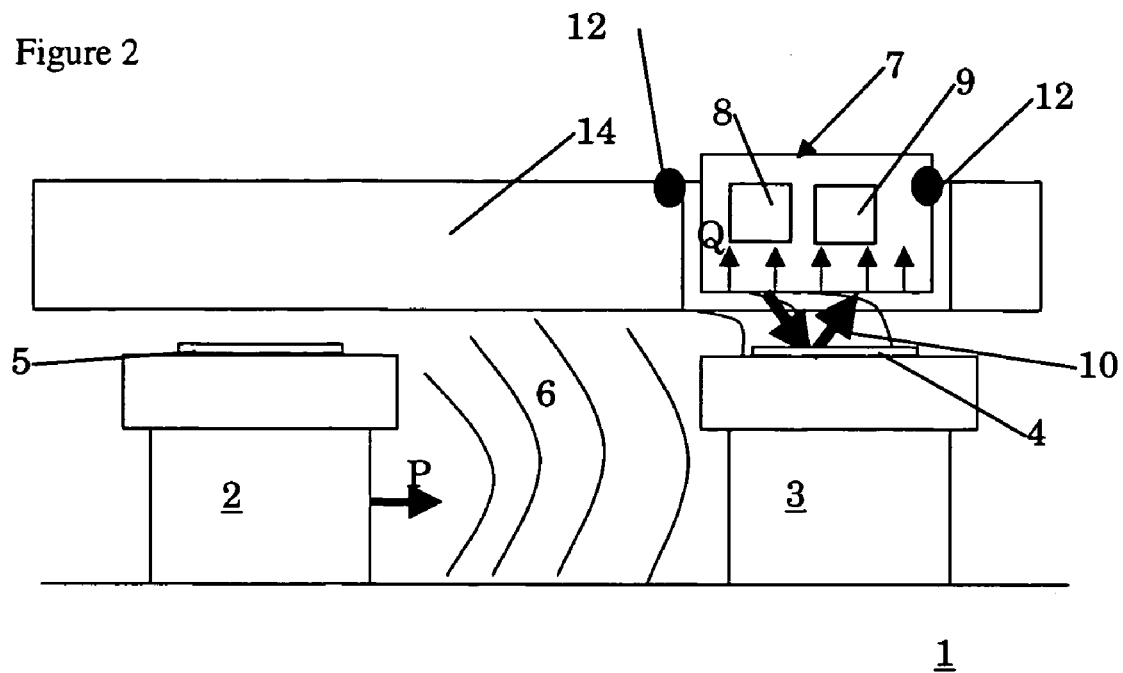
FIG. 2 a conventional setup for a lithographic apparatus, wherein no pressure shield is applied according to an embodiment of the invention.

FIG. 2 shows a side view of a portion of a conventional setup of a lithographic apparatus, in particular, a multiple table setup 1, e.g., two or more substrate tables. In the shown embodiment, two tables 2, 3 are used in parallel, wherein on one table 3, preparatory steps may be carried out, such as measurement of a substrate 4, while the other table 2 is used for exposure purposes of another substrate 5, e.g., receiving a patterned beam from a projection system (not shown). As is shown schematically by waves 6, the moving table 2 (the movement indicated schematically by arrow P) creates pressure waves that impinge on the other table 3 and the measurement unit 7 in the vicinity thereof. Arrows Q show that most, if not all, of the bottom area of the measurement unit is hit by the pressure wave, causing a relatively large displacement force on the measurement unit 7. Typically, such a measurement unit 7 is used to carry out an alignment step and/or to create a height map of a substrate. Specifically, for alignment, the measurement unit 7 comprises an alignment module 8 configured to measure in plane positions of a substrate. For level sensing, the measurement unit 7 comprises a level sensor 9 configured to measure out of plane positions of a substrate.

In an embodiment, the measurement unit 7 is an example of a radiation control system. The measurement unit 7 comprises typically a laser source or the like (not shown) that provides a radiation beam 10 to be projected on the substrate 4, reflected by the substrate 4, and measured in the unit 7. A radiation control system encompasses systems which control radiation, irrespective whether the radiation is produced in the system or only relayed from an outside source. Furthermore, the radiation control system typically both emits and receives radiation but may only emit or receive radiation.

As already indicated, the moving table 2, especially the acceleration thereof, creates pressure waves that impinge on the measurement unit 7. Where the unit 7 must operate with (sub-) nanometer accuracy, these pressure waves can provide displacements which may be deleterious.

Figure 3:
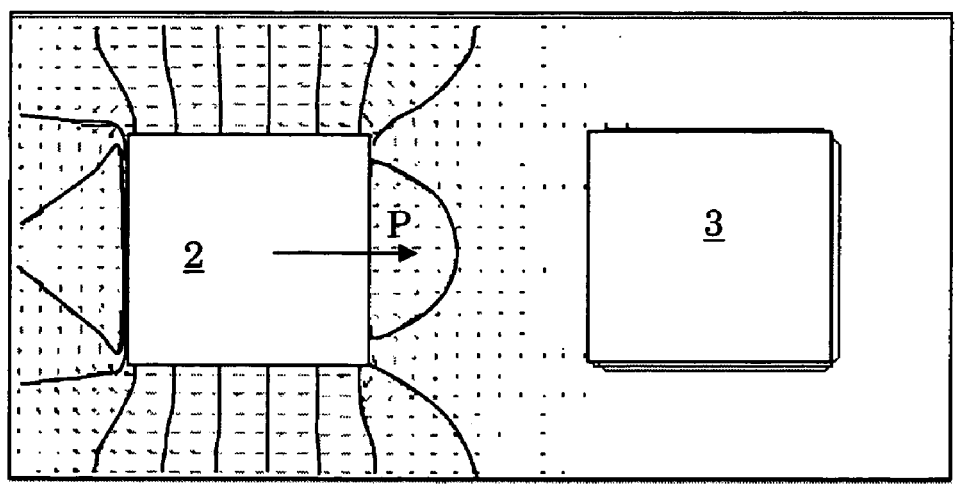
FIG. 3 illustrates a top view of a simulated pressure profile in the ambient environment around the tables 2 and 3 depicted in FIG. 2.

FIG. 3 illustrates a top view of a simulated pressure profile 11 in the ambient environment around the tables 2 and 3. Pressure fluctuations in the ambient environment during acceleration can be estimated, assuming a 1D problem in which a column of gas with a L has to be accelerated: $\Delta P_{acc} \approx L \rho dV/dt$, where $\rho$ is the gas density and typical accelerations $dV/dt$ of >10 m/s$^2$. Furthermore, constant velocities may induce a pressure fluctuation due to gas which is moving away in front of the table that can be estimated to be 1 to 2 times the stagnation pressure which is: $\Delta P_{stag} \approx \frac{1}{2}\rho V^2$.

A pressure profile 11 was calculated at t=0.04 sec where table 2 is accelerated from 0 to 0.48 m/s with dV/dt=12 m/s$^2$ using computational fluid dynamics. Contour lines show a pressure difference of 1.6 Pa. From FIG. 3, it can be seen that a variation of several Pa pressure force is possible. With an assumption of an effective area of (0.1×0.1) m$^2$, displacements in the order of several nanometers are possible even for relatively stiff mountings 12, having a stiffness of 1E7 N/m, holding the measurement unit 7. Such displacement can be distributed integrally over the measurement unit 7 and need not be concentrated in the mountings 12 shown in FIG. 2.

Figure 4:
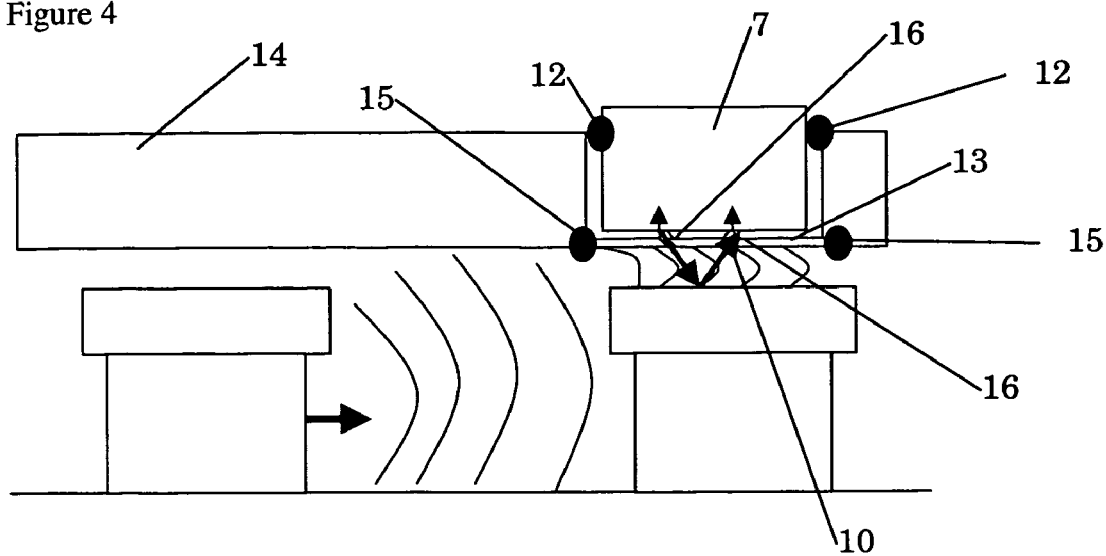
FIG. 4 schematically shows a first embodiment of the invention, illustrating a pressure shield having through holes.

In FIG. 4 a first embodiment of the invention is shown. Here, the measurement unit 7 is provided with a pressure shield 13 mounted on the metrology frame 14. The pressure shield 13 provides passage to the one or more radiation beams 10 of the measurement system 7 so that contactless measurement of the substrate 4 may be carried out unhindered. However, the pressure shield 13 blocks or at least substantially reduces the pressure waves 6 from reaching the measurement unit 7. In this way displacement of the measurement system caused by the pressure waves can be suppressed. In an embodiment, the pressure shield 13 is mechanically uncoupled from the measurement system 7. Typically, this means that no direct mechanical coupling to the measurement system is present but only indirect coupling, for instance, via metrology frame 14. However, a direct coupling may be used that is very elastic, so that the wave energy is lost in the elastic coupling without displacing the measurement unit 7. Since the metrology frame 14 has a high mass and stiffness, local pressure variations are damped in the shield 13 and substantially do not reach the measurement unit 7. Alternatively, the shield may be completely uncoupled from the measurement system, for instance, by providing a shield that is mounted to an external static frame (not shown) instead of the metrology frame 14 that is used for holding the radiation control system 7.

FIG. 4 schematically shows a pressure shield 13 that is mounted directly on the metrology frame 14 via mounting 15, which comprises through holes 16. The radiation beam 10 can pass through the holes 16. Since the through holes 16 are relatively small in width, only a limited fraction of the pressure waves reach the measurement unit 7 and do not provide a significant displacement of the measurement unit 7.

Figure 5:
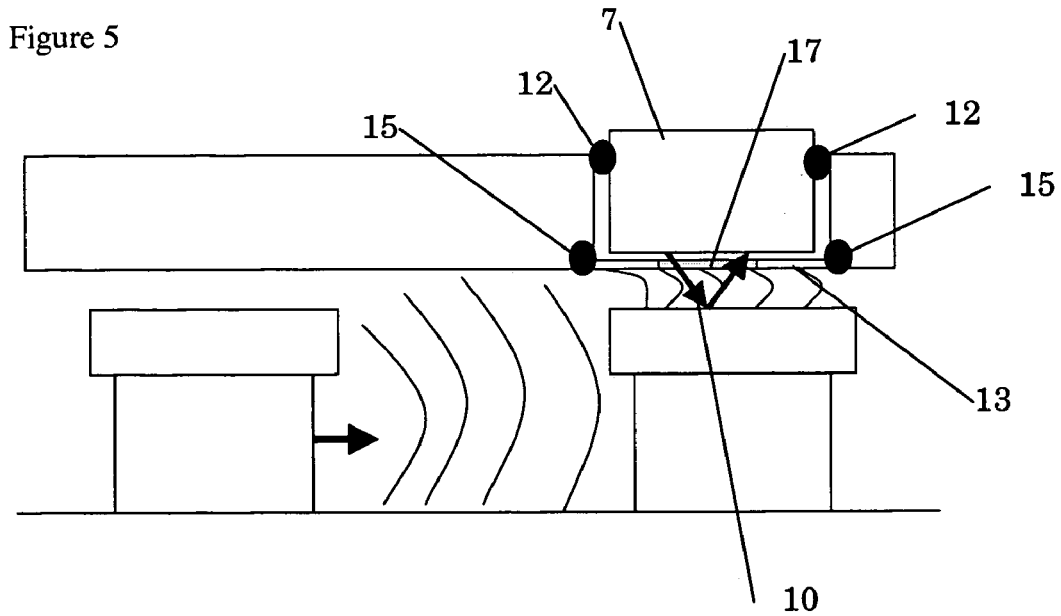
FIG. 5 schematically shows a second embodiment of the invention, illustrating a substantially transparent pressure shield.

In the embodiment of FIG. 5, the pressure shield 13 comprises a transparent plate 17 having low or zero optical power. In this embodiment, the measurement unit 7 is completely shielded from the pressure waves 6 and the transparent plate 17 transmits the beam 10 unhindered. If the plate 13 is substantially flat, a vertical or horizontal displacement thereof due to an impinging pressure wave has little or no impact on the measurement results of the measurement unit 7. Where the plate has a weak tilt, some errors may be introduced which can be dealt with by stiff pressure shield mountings 15.

Figure 6:
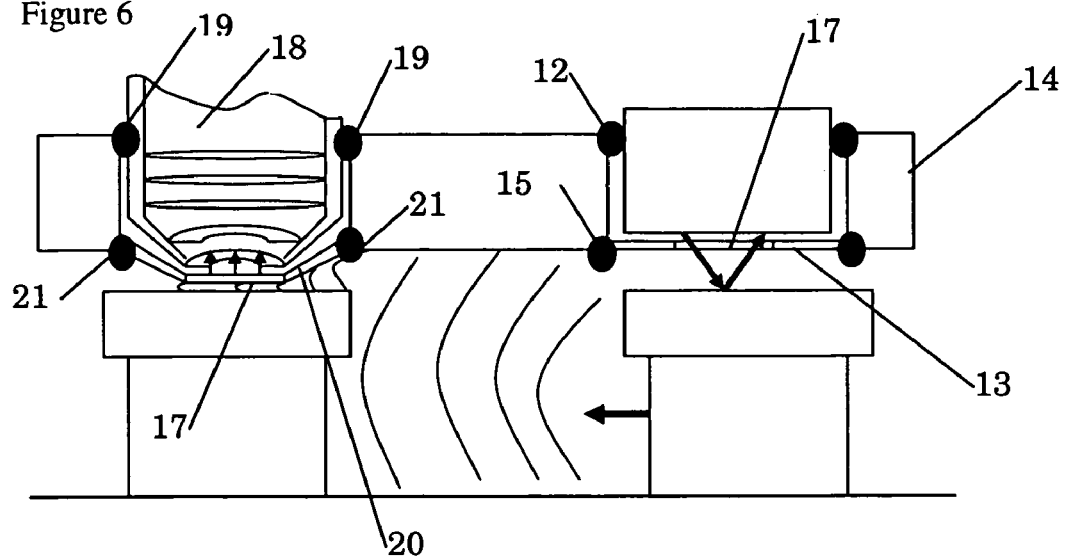
FIG. 6 schematically shows a third embodiment of the invention, illustrating a pressure shield for a projection system and an alignment system.

In FIG. 6, another embodiment is schematically shown, wherein the shielding is applied to a projection system 18 as an example of a radiation control system. Here, also, the pressure waves may put stress on the mountings 19 of the projection system, which may give rise to unwanted displacements. Accordingly, a pressure shield 20 is provided that is mechanically uncoupled from the projection system 18 to help shield the projection system 18 against pressure waves 6 induced by one or more article supports 2, 3 so as to help prevent displacement of the projection system caused by the pressure waves 6. The pressure shield 20 is mounted to the metrology frame 14 through mountings 21 and follows the shape of the projection system 18 (although it does not need to). It has a transparent plate 17 to provide passage to the imaging beam of the projection system 18. Hence the lowest optical part of the projection system 18 is formed by a flat plate or low power element that is mounted on the metrology frame 14. Alternatively, a small opening for the radiation path can be used, possibly in combination with a purge hood or an immersion structure for immersion lithography purposes.

Figure 7:
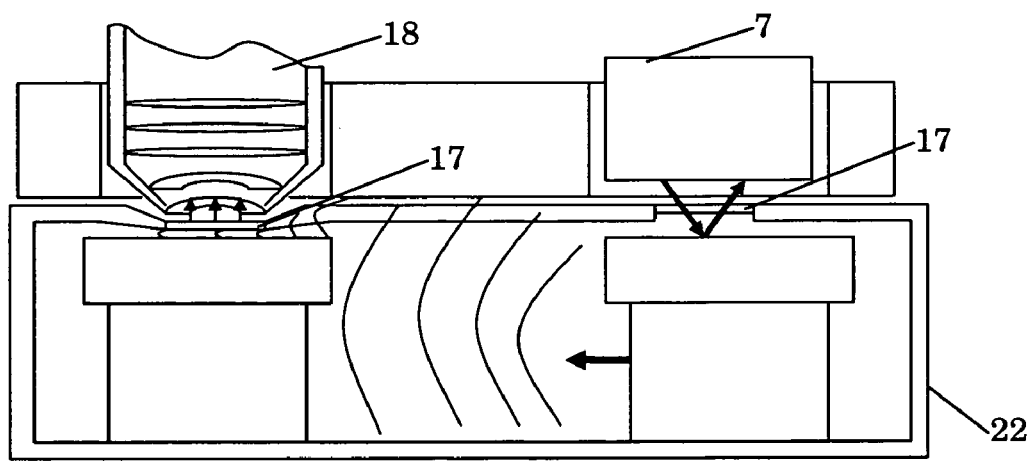
FIG. 7 shows a fourth embodiment of the invention, illustrating a further shielding arrangement.

In FIG. 7, a fourth embodiment is schematically shown of a shielding arrangement of a lithographic apparatus. In particular, in this arrangement, the substrate table setup 1 is entirely or significantly shielded in a compartment 22 which is accessible by the radiation control systems 7 and 18 (e.g., projection system 18 and measurement unit 7) via transparent plates 17 or small through holes mounted in the shield 22. In this arrangement barometric pressure correction can be carried out for instance, by actively controlling the barometric pressure in the compartment 22. Accordingly, gas pressure variation and corresponding refractive index changes may also be slowed down.

Although the invention has been described with reference to the embodiments described herein, the skilled person will readily appreciate that variations and modifications to these embodiments are possible without departing from the scope of the claims. Specifically, the radiation control system can be of other nature than the shown projection, alignment and/or leveling systems. For instance, such a radiation control system may comprise an interferometric measurement system used for in plane measurement of the tables 2, 3 shown in FIG. 2. Also, the type of radiation is not of significant importance and may be the radiation used to expose the substrate (i.e., to transfer a pattern to the substrate) or can be of other wavelengths, for instance, visible light or other type of suitable electromagnetic waves. These variations and modifications are deemed to be comprised in the scope of the claims below. Furthermore, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other' substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that an embodiment of the invention may be used in other applications, for example imprint lithography, and where the context allows, is not limited to lithography. In imprint lithography a topography in a patterning device defines the pattern created on a substrate. The topography of the patterning device may be pressed into a layer of imprintable medium supplied to the substrate whereupon the medium is cured, for example, by applying electromagnetic radiation, heat, pressure or a combination thereof. The patterning device is moved out of the medium leaving a pattern in it after the medium is cured.

The terms "radiation" and "beam" used herein encompass all types of electromagnetic radiation, including ultraviolet (UV) radiation (e.g. having a wavelength of or about 365, 355, 248, 193, 157 or 126 nm). The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. For example, an embodiment of the invention may take the form of a computer program containing one or more sequences of machine-readable instructions describing a method as disclosed herein, or a data storage medium (e.g. semiconductor memory, magnetic or optical disk) having such a computer program stored therein. Thus, it will be apparent to one skilled in the art that modifications may be made to the invention as described without departing from the scope of the claims set out below.

The invention claimed is:

1. A lithographic apparatus, comprising:
a movable article support configured to hold and move an article;

a radiation control system configured to control a beam of radiation to be targeted onto the article, the article support, or both, the article to be moved relatively to the radiation control system by the movable article support for measurement, exposure, or both purposes; and a pressure shield that is mechanically uncoupled from the radiation control system to shield against pressure waves induced by the article support so as to help prevent displacement of the radiation control system caused by the pressure waves.

2. The apparatus according to claim 1, wherein the pressure shield provides passage to the beam of radiation of the radiation control system.

3. The apparatus according to claim 2, wherein the pressure shield comprises through holes.

4. The apparatus according to claim 2, wherein the pressure shield comprises a substantially transparent plate having low or zero optical power.

5. The apparatus according to claim 1, wherein the pressure shield comprises a plate mounted to a metrology frame that is shared by the radiation control system.

6. The apparatus according to claim 1, wherein the pressure shield comprises a plate that is mounted to a static frame not directly shared by the radiation control system.

7. The apparatus according to claim 1, wherein the movable article support is substantially shielded from the radiation control system by the pressure shield.

8. The apparatus according to claim 1, wherein the radiation control system comprises a projection system configured to project a patterned radiation beam onto a target portion of the article.

9. The apparatus according to claim 1, wherein the radiation control system comprises a measurement system configured to project a measurement beam onto a portion of the article, the article support or both or to detect a measurement beam travelling from a portion of the article, the article support, or both.

10. The apparatus according to claim 9, wherein the measurement system comprises an alignment system, a level sensor system, or both.

11. The apparatus according to claim 9, wherein the measurement system comprises an interferometric measurement system.

12. The apparatus according to claim 1, wherein the article support is configured to hold a patterning device, the patterning device configured to impart the beam of radiation with a pattern in its cross-section.

13. The apparatus according claim 1, wherein the article support is configured to hold a substrate to receive on a target portion of the substrate a patterned beam.

14. A lithographic apparatus configured to transfer a pattern to a substrate, comprising:

a table configured to be moveable and to hold a substrate or a patterning device; and a pressure shield that is not directly connected to a displacement sensitive device to shield the device from pressure waves induced by movement of the table so as to substantially prevent displacement of the device caused by the pressure waves.

15. The apparatus according to claim 14, wherein the displacement sensitive device comprises a projection system configured to project a patterned radiation beam onto a target portion of a substrate.

16. The apparatus according to claim 14, wherein the pressure shield provides passage to a beam of radiation to or from the displacement sensitive device.

17. The apparatus according to claim 14, wherein the pressure shield comprises a plate mounted to a metrology frame to which the displacement sensitive device is connected.

18. The apparatus according to claim 14, wherein the pressure shield comprises a plate mounted to a static frame not directly connected to the displacement sensitive device.

19. A device manufacturing method, comprising:

moving a table holding a substrate or a patterning device;

shielding a displacement sensitive device from pressure waves induced by the movement of the table so as to substantially prevent displacement of the device caused by the pressure waves; and transferring a pattern to a substrate.

20. The method according to claim 19, wherein the displacement sensitive device comprises a projection system configured to project the pattern onto a target portion of the substrate.

21. The method according to claim 19, wherein the displacement sensitive device comprises a measurement system configured to project a measurement beam onto a portion of the table, the substrate or the patterning device or to detect a measurement beam travelling from a portion of the table, the substrate or the patterning device.

* * * * *